(12) United States Patent
Junkins et al.

(10) Patent No.: US 7,133,290 B2
(45) Date of Patent: Nov. 7, 2006

(54) METHOD AND APPARATUS FOR SECURING AN INFORMATION HANDLING SYSTEM

(75) Inventors: Andrew T. Junkins, Round Rock, TX (US); Edmond Bailey, Austin, TX (US); Joshua M. Boggs, Round Rock, TX (US); Timothy C. Dearborn, Lakeway, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/998,072

(22) Filed: Nov. 24, 2004

(65) Prior Publication Data

US 2006/0109618 A1    May 25, 2006

(51) Int. Cl.
*G06F 1/16* (2006.01)
(52) U.S. Cl. .................. 361/726; 312/215; 174/35 GC
(58) Field of Classification Search ........ 361/690–691, 361/679–687, 724, 727; 62/259.2; 396/564; 174/35 GC; 312/223.2, 215, 222
See application file for complete search history.

(56) References Cited

U.S. PATENT DOCUMENTS

| | | | |
|---|---|---|---|
| 5,960,172 A | 9/1999 | Hwang | |
| 6,075,693 A | 6/2000 | Leman | |
| 6,266,239 B1 * | 7/2001 | Cook et al. ................. | 361/683 |
| 6,667,891 B1 * | 12/2003 | Coglitore et al. ........... | 361/796 |
| 6,816,370 B1 * | 11/2004 | Searby et al. ............... | 361/685 |
| 2004/0233619 A1 | 11/2004 | Heistand, II et al. | |

\* cited by examiner

*Primary Examiner*—Hung Van Duong
(74) *Attorney, Agent, or Firm*—Haynes and Boone, LLP

(57) ABSTRACT

An apparatus for securing an information handling system includes a chassis cover defining a opening therein, the chassis cover including a locking member, and a panel operable to be secured in the opening or removed from the opening. In an embodiment, the removal of the panel is accomplished only when the chassis cover is in the open position. The chassis cover may be attached to a chassis in order to restrict access to some components on the chassis while allowing an option to either allow or restrict access to other components on the chassis.

24 Claims, 11 Drawing Sheets

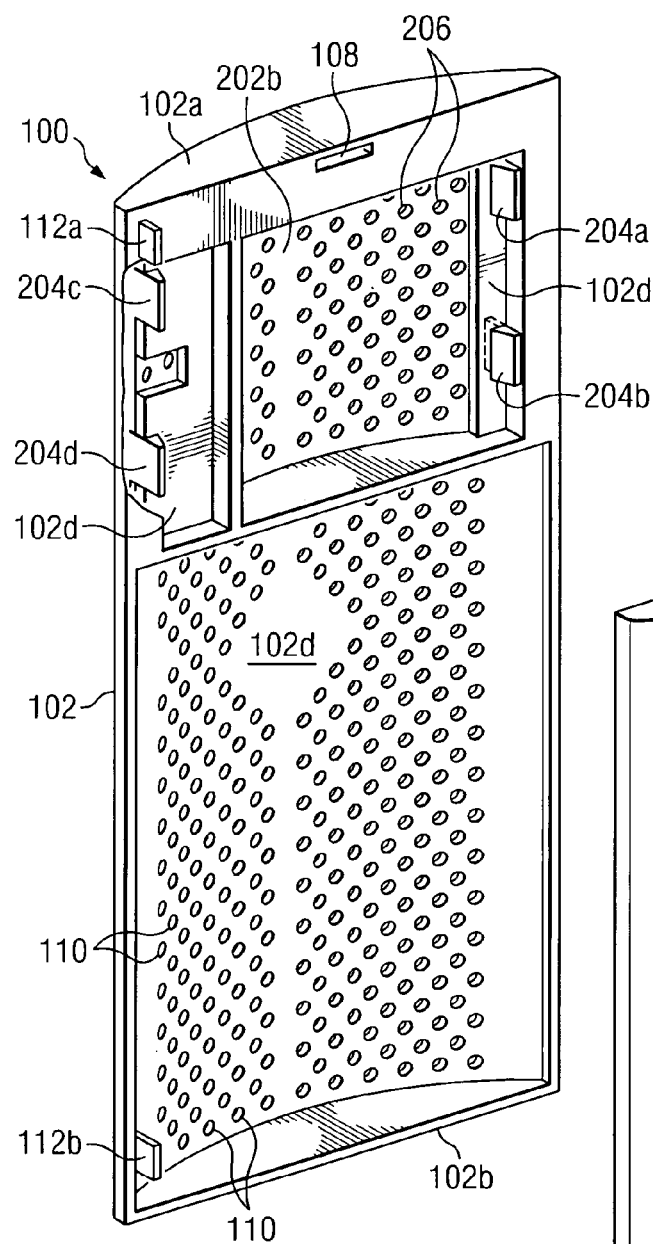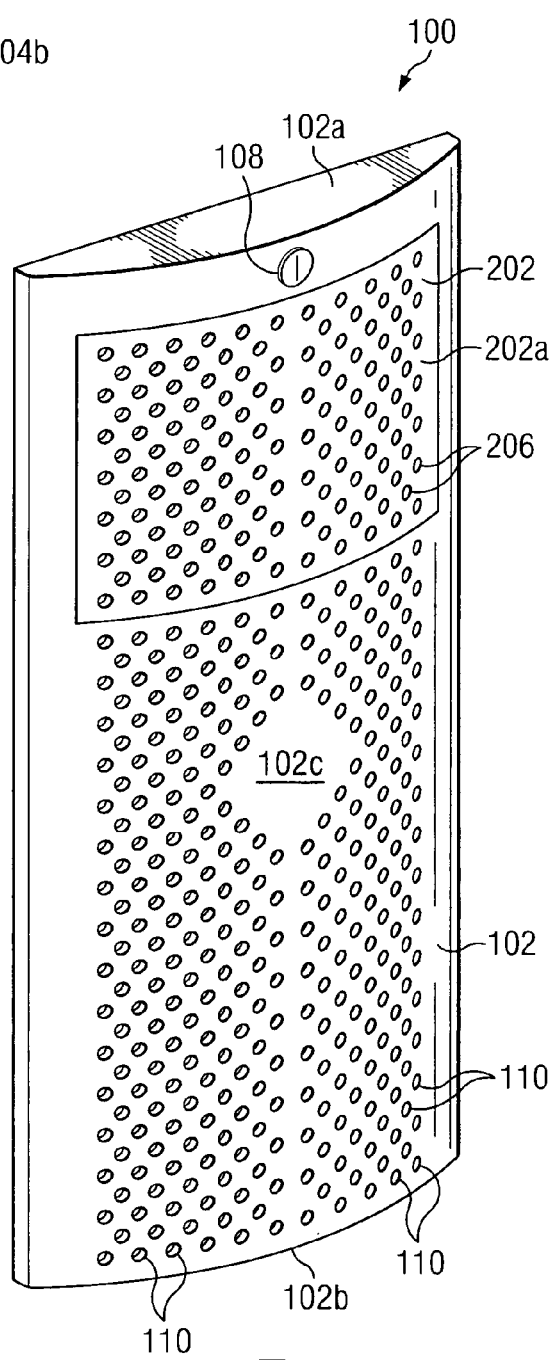
Fig. 4b
Fig. 4c

METHOD AND APPARATUS FOR SECURING AN INFORMATION HANDLING SYSTEM

BACKGROUND

The present disclosure relates generally to information handling systems, and more particularly to a method and apparatus for securing an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is often desirable to provide a security device for information handling system chassis in order to protect components of the information handling system from theft and to restrict access to devices in the information handling system.

Typically, a locking cover is provided on the information handling system chassis which allows all access to the hard drives and peripheral devices to be restricted, securing those components in the information handling system chassis and ensuring that the information handling system cannot be accessed.

However, it is also desirable on occasion to protect data on the hard drives while still allowing access to the peripheral devices such as, for example, optical drives, floppy drives, and/or tape backup drives. Locking covers must be continually unlocked and locked to access the peripheral devices while keeping the hard drives secured.

Accordingly, it would be desirable to provide a method and apparatus for securing an information handling system absent the disadvantages found in the prior methods discussed above.

SUMMARY

According to one embodiment, an apparatus for securing an information handling system is provided comprising a chassis cover defining a opening therein, the chassis cover including a locking member, and a panel operable to be secured in the opening or removed from the opening. In an embodiment, the removal of the panel is accomplished only when the chassis cover is in the open position.

A principal advantage of this embodiment is that the chassis cover and panel may be configured to restrict access to the hard drives and peripherals. The chassis cover and panel may also be reconfigured in order to restrict access to the hard drives while allowing access to the peripherals.

BRIEF DESCRIPTION OF THE DRAWINGS

FIG. 2b is a rear perspective view illustrating an embodiment of the back of the chassis cover of FIG. 2a.

FIG. 3b is a rear perspective view illustrating an embodiment of the back of the panel of FIG. 3a.

FIG. 4a is a perspective view illustrating an embodiment of the operation of the chassis cover of FIG. 2a and the panel of FIG. 3a.

FIG. 4b is a rear perspective view illustrating an embodiment of the panel of FIG. 3a secured to the chassis cover of FIG. 2a.

FIG. 4c is a perspective view illustrating an embodiment of the panel of FIG. 3a secured to the chassis cover of FIG. 2a.

FIG. 6b is a perspective view illustrating an embodiment of the panel of FIG. 3a secured to the chassis cover and chassis of FIG. 6a.

FIG. 7b is a rear perspective view illustrating an embodiment of the operation of the chassis cover and panel of FIG. 7a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
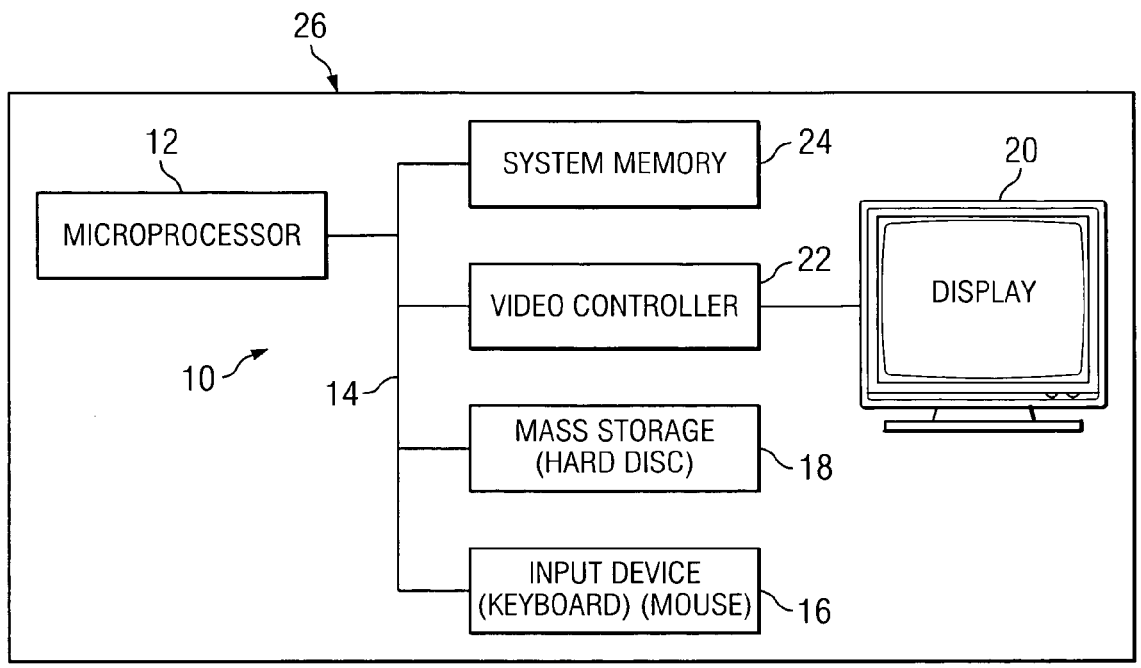
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. A chassis 26 may be provided in order to house some or all of the components of the information handling system 10. It should be understood that other busses and intermediate circuits can be deployed between the components described above and microprocessor 12 to facilitate interconnection between the components and the microprocessor.

Figure 2A:
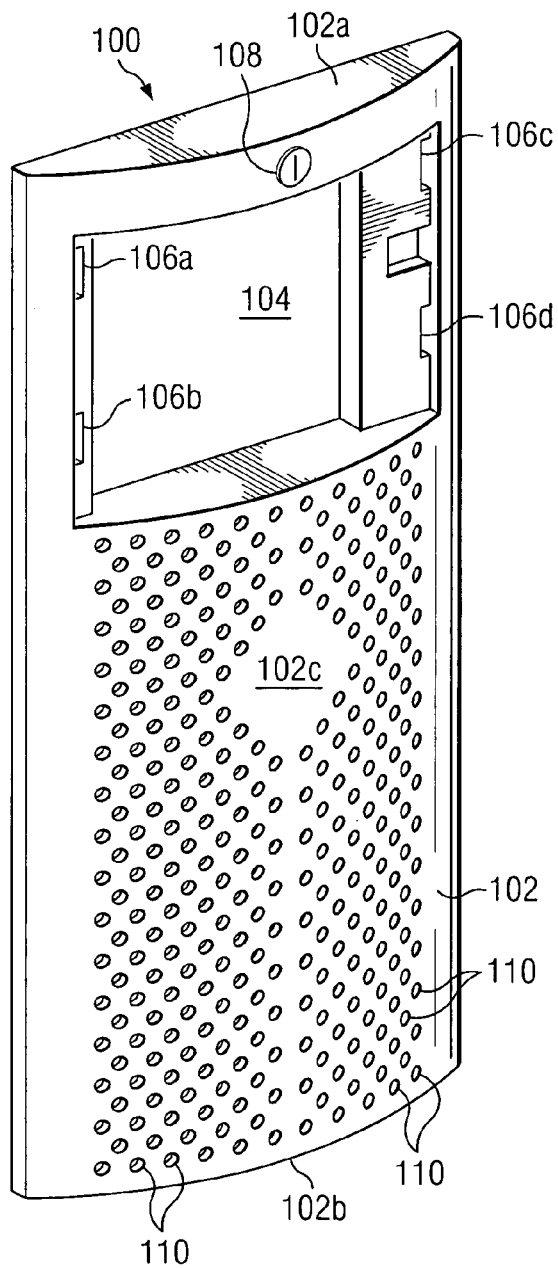
FIG. 2a is a perspective view illustrating an embodiment of a chassis cover for an apparatus for securing an information handling system.
Figure 2B:
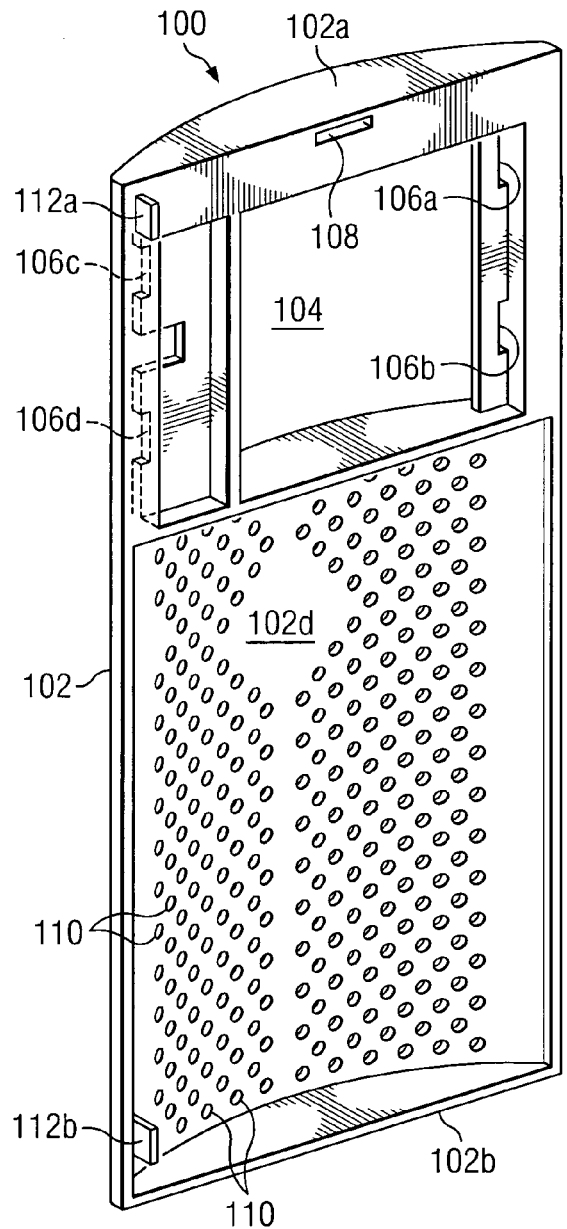

Referring now to FIGS. 2a and 2b, an apparatus for securing an information handling system 100 includes an elongated cover 102 having a top 102a, a bottom 102b opposite the top 102a, a front 102c, and a back 102d opposite the front 102c. The cover 102 defines a opening 104 extending through the cover 102 from the front 102c to the back 102d and positioned adjacent the top 102a. A plurality of panel coupling members 106a, 106b, 106c, and 106d are positioned about the perimeter of the opening 104 in a spaced apart relationship and, in one embodiment, include a plurality of passageways defined by the cover 102 and extending through the cover 102 from the front 102c to the rear 102d. A locking member 108 is positioned on the cover 102 between the top 102a and the opening 104. A plurality of apertures 110 are defined by the cover 102 and extend through the cover 102 from the front 102c to the back 102d. A plurality of chassis coupling members 112a and 112b extend from the back 102d and along an edge of cover 102.

Figure 3C:
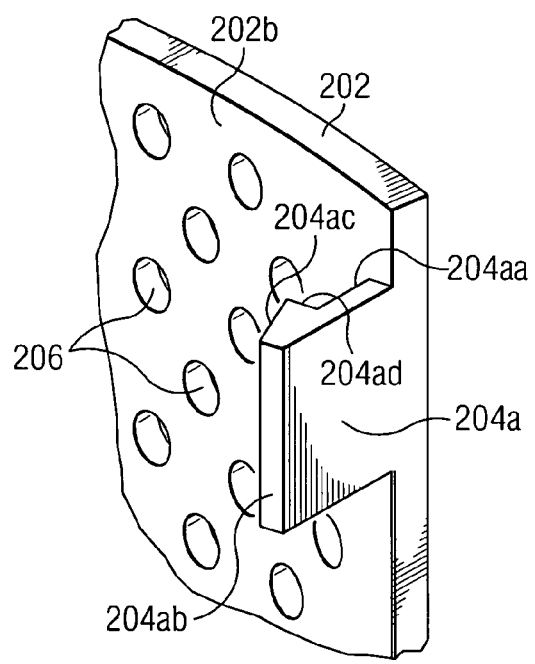
FIG. 3c is a perspective view illustrating an embodiment of a cover securing member used with the panel of FIGS. 3a and 3b.
Figure 3A:
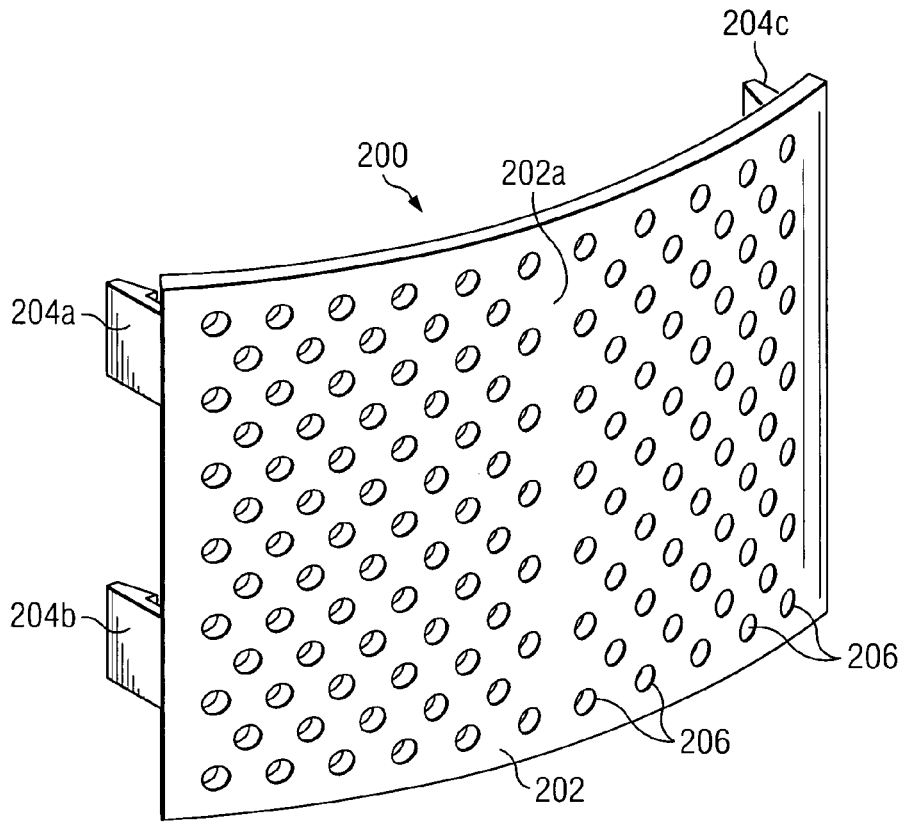
FIG. 3a is a perspective view illustrating an embodiment of an panel used with the chassis cover of FIGS. 2a and 2b.
Figure 3B:
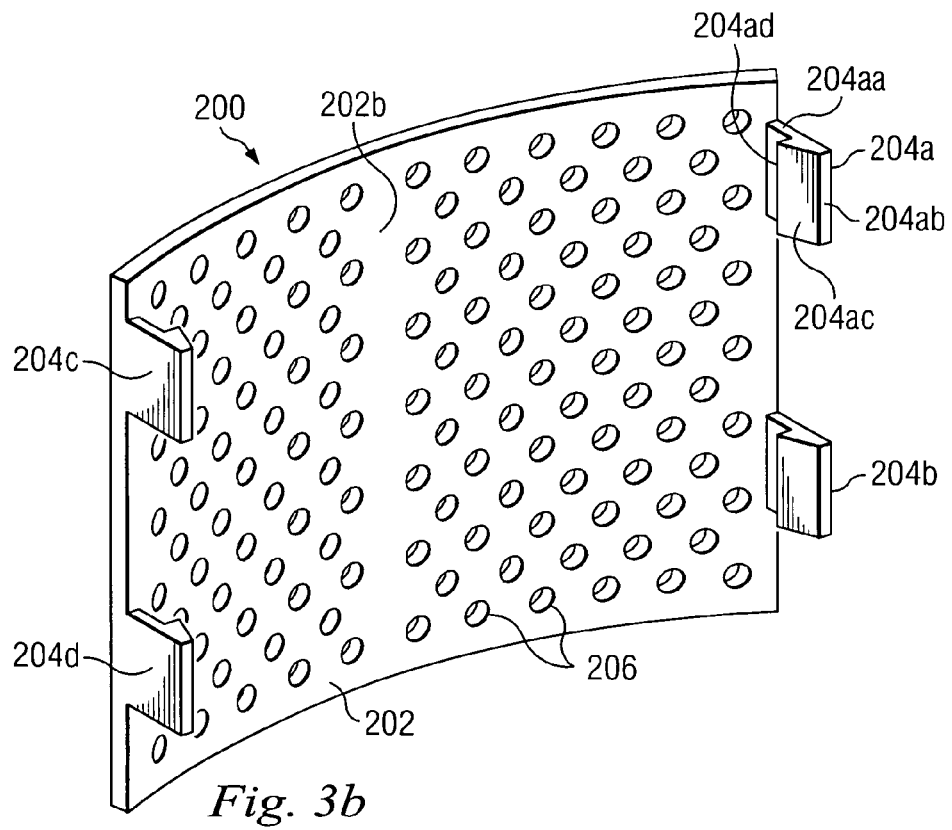
Figure 4A:
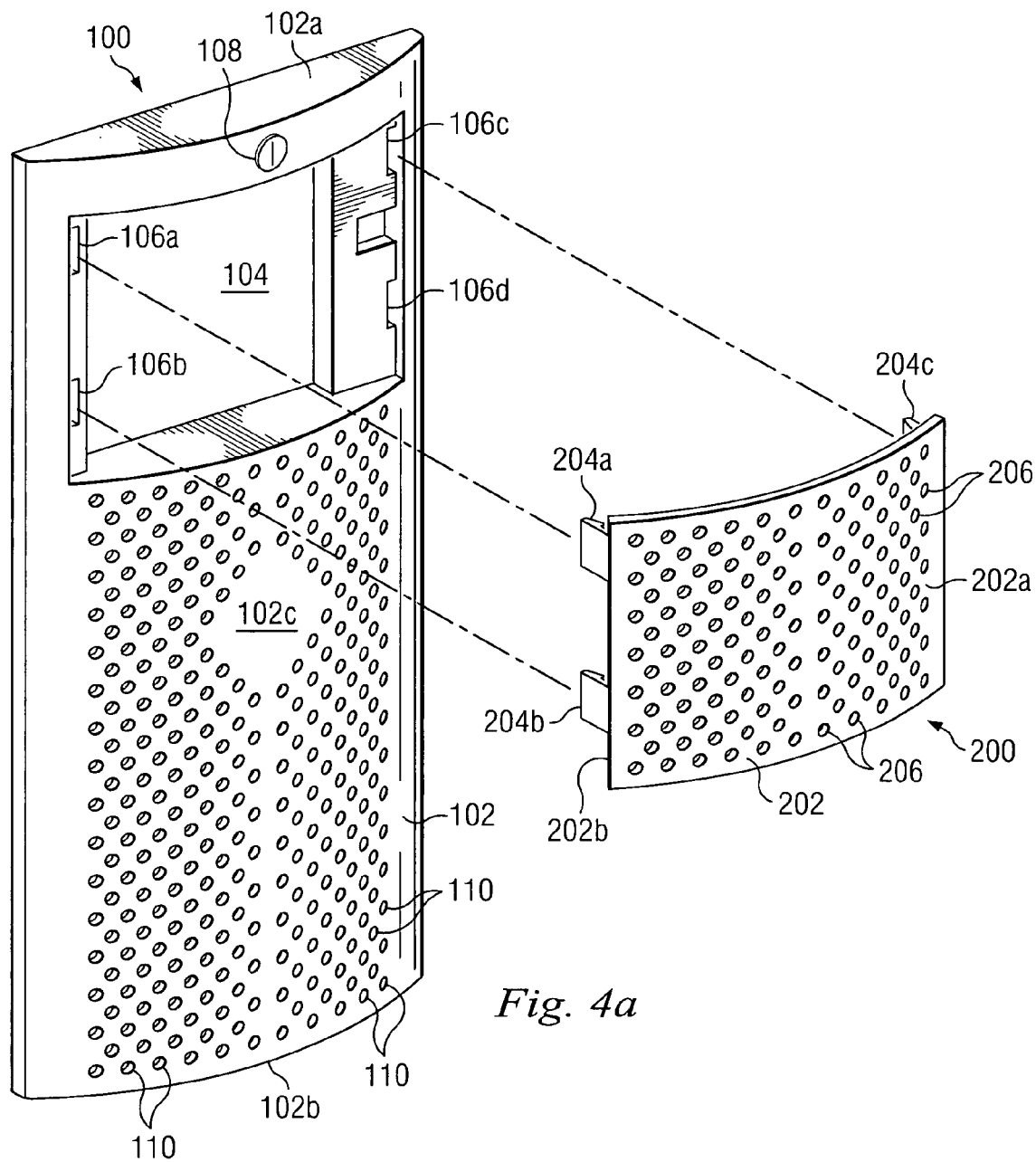

Referring now to FIGS. 3a, 3b and 3c, the apparatus 100 also includes a panel 200 having a substantially square body 202 having a front 202a and a back 202b opposite the front 202a. A plurality of cover coupling members 204a, 204b, 204c, and 204d extending from the back 202b of cover 202 and about the perimeter of cover 202 in a spaced apart relationship. A plurality of apertures 206 are defined by the panel 200 and extend through the panel 200 from the front 202a to the back 202b. Cover coupling member 204a includes a flexible beam 204aa extending from the back 202b of cover 200. A distal end 204ab of the beam 204aa includes a beveled surface 204ac and a catch surface 204ad. Cover coupling members 204b, 204c, and 204d are substantially similar to cover coupling member 204a with each including respective flexible beams, distal ends, beveled surfaces, and catch surfaces.

Referring now to FIGS. 3c, 4a, 4b and 4c, in operation, the panel 200 may be secured to the cover 102 by orienting the panel 200 such that the cover coupling members 204a, 204b, 204c, and 204d such that they line up with panel coupling members 106a, 106b, 106c, and 106d on cover 102. The panel 200 is then brought into engagement with cover 102 by pushing, for example, the distal end 204ac of cover coupling member 204 into the panel coupling member 106a. Further pushing of cover coupling member 204a into panel coupling member 106a results in the beveled surface 204ac causing flexible beam 204aa to flex, allowing the cover coupling member 204a through the panel coupling member 106a until the catch surface 204ad contacts the back 102d of cover 102 adjacent the panel coupling member 106a and secures the cover coupling member 204a to the cover 102. Cover coupling members 204b, 204c, and 204d operate in substantially the same manner as cover coupling member 204a, and with all of the cover coupling members 204a, 204b, 204c, and 204d secured in their respective panel coupling members 106a, 106b, 106c, and 106d, the panel 200 is secured in the cover 102. The panel 200 may then removed from the cover 102 only by accessing the back 102d of cover 102 and flexing each of the cover coupling members 204a, 204b, 204c, and 204d in order to release them from panel coupling members 106a, 106b, 106c, and 106d, respectively.

Figure 5:
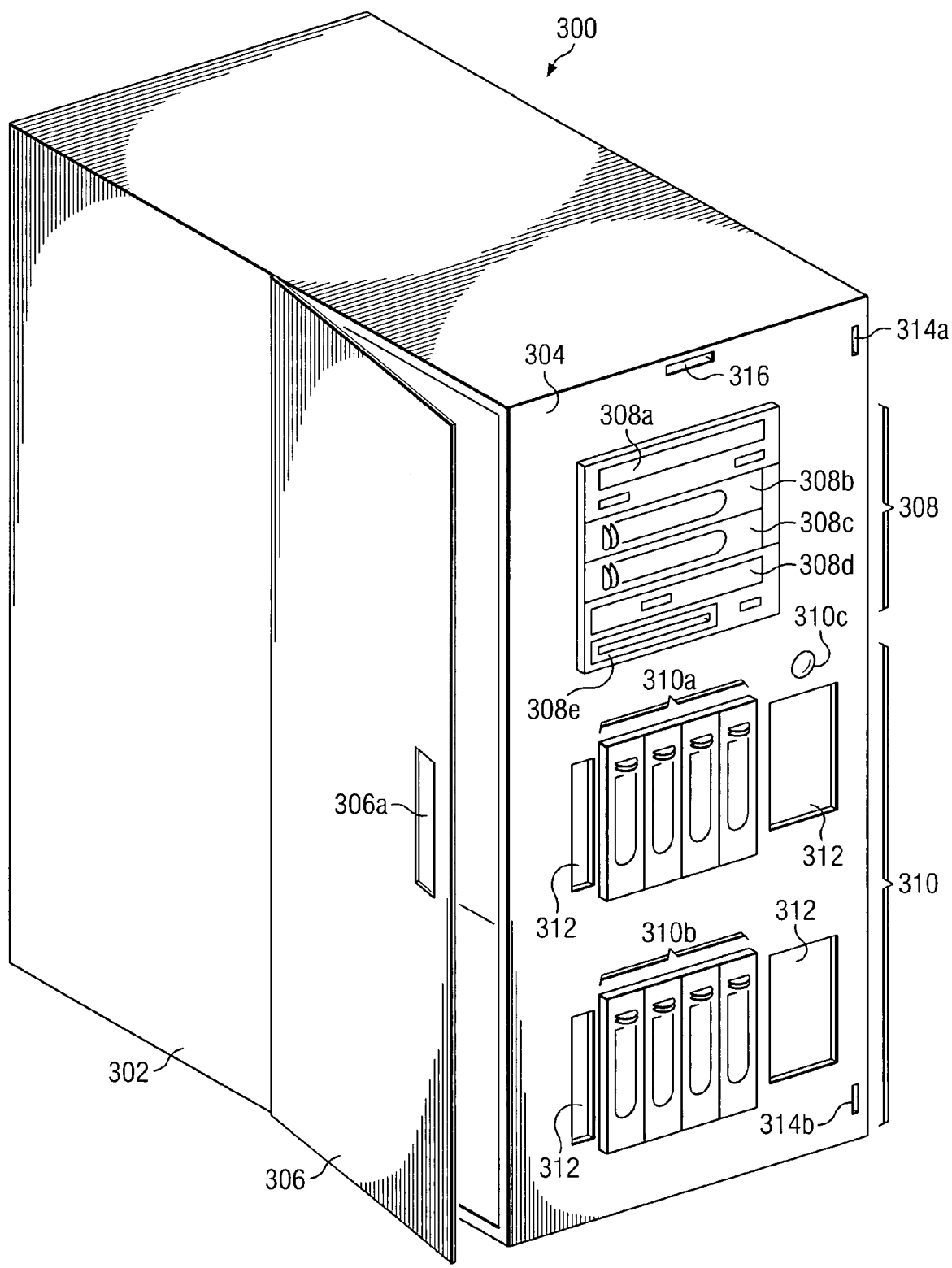
FIG. 5 is a perspective view illustrating an embodiment of a chassis.
Figure 6A:
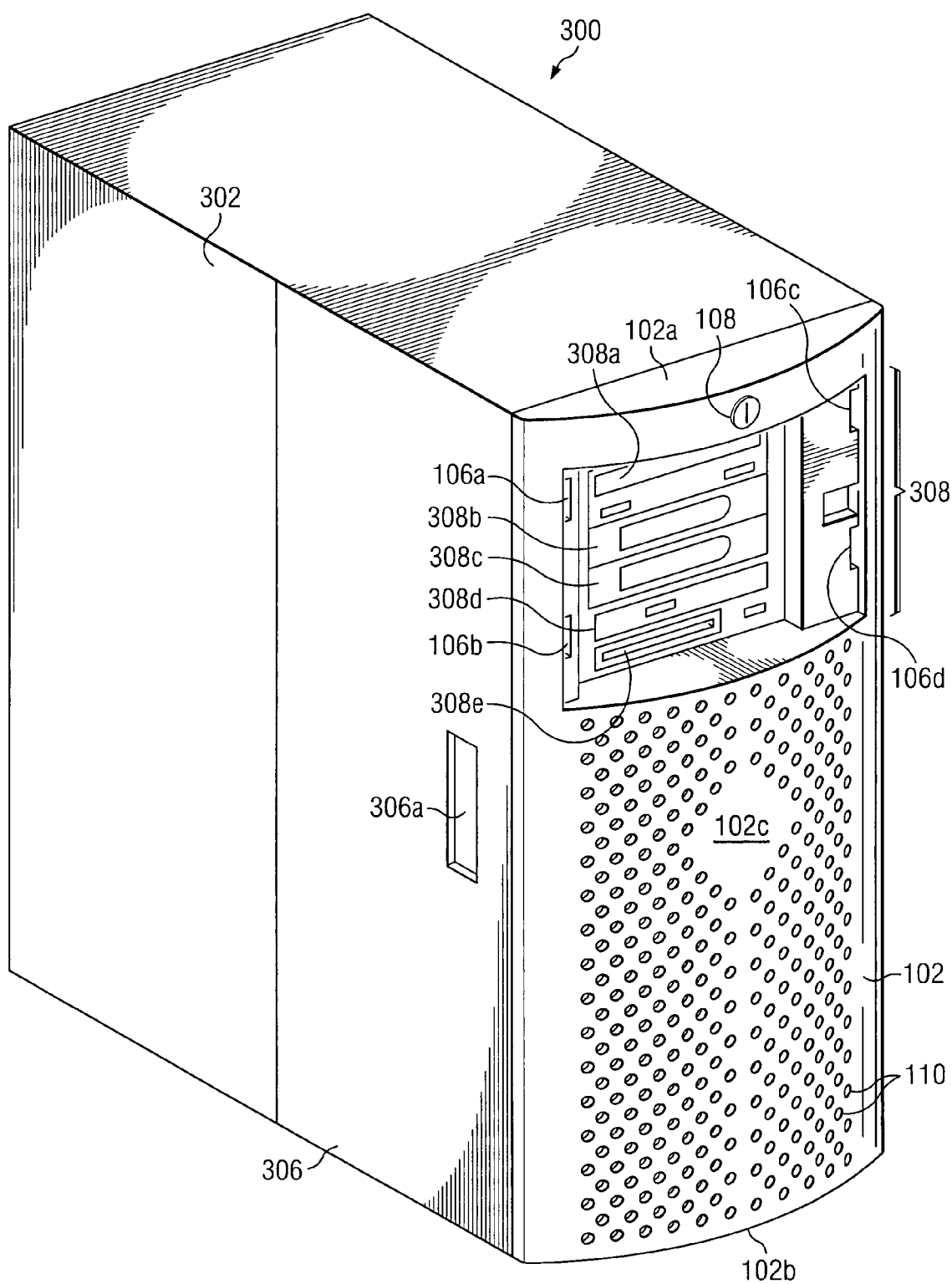
FIG. 6a is a perspective view illustrating an embodiment of the chassis cover of FIG. 2a coupled to the chassis of FIG. 5.
Figure 6B:
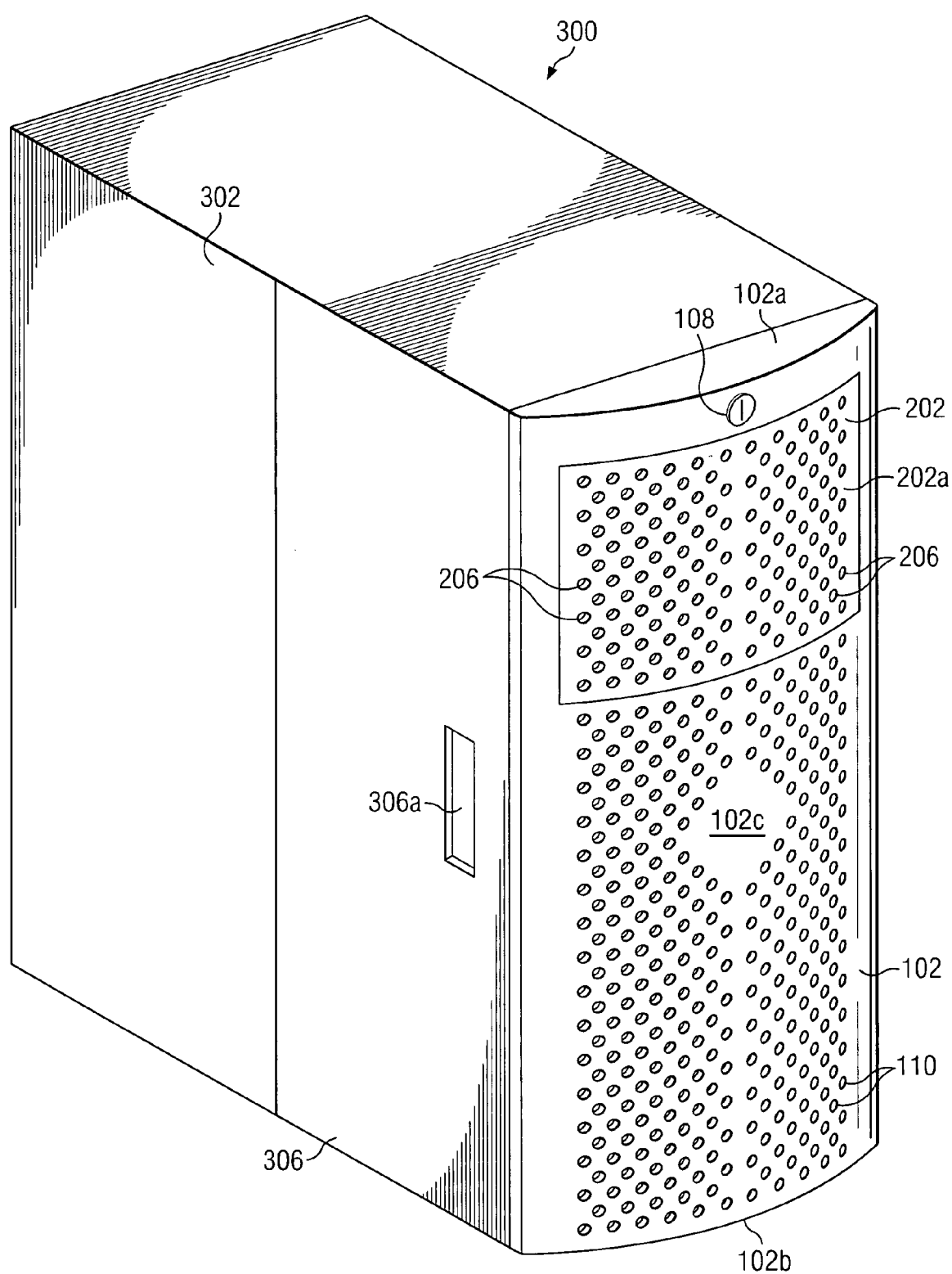

Referring now to FIG. 5, an alternative embodiment of an apparatus for securing an information handling system 300 is substantially identical in design and operation to the apparatus 100 described above with reference to FIGS. 2a, 2b, 3a, 3b, 3c, 4a, 4b, and 4c, with the addition of a chassis 302, which may be the chassis 26 illustrated in FIG. 1, housing an information handling system, which may be the information handling system 10 illustrated in FIG. 1. The chassis 302 includes a front surface 304 and a chassis door 306 positioned adjacent the front surface 304 and pivotally coupled to the chassis 302. A handle 306a is included on an edge of the chassis door 306. In one embodiment, the chassis door 306 provides access to components housed within the chassis 302. Chassis surface 304 includes a first component 308 on an upper section of chassis surface 304 and a second component 310 positioned adjacent the first component 308 and on a lower section of chassis surface 304. First component 308 may include, for example, a variety of peripheral devices such as a tape drive 308a, an SCSI drive 308b, an SCSI drive 308c, an optical drive 308d, and a floppy drive 308e. Second component 310 may includes, for example, a variety of hard drives such as a plurality of SCSI drives 310a and a plurality of SCSI drives 310b. Second component 310 may also include a power control 310c. A plurality of air flow passageways 312 may be defined by chassis surface 304 and positioned adjacent the SCSI drives 310a and 310b. The chassis surface also includes a plurality of cover coupling members 314a and 314b positioned along an edge of the chassis surface 304 in a spaced apart relationship. A chassis lock member 316 is positioned on an upper edge of the chassis surface 304 and adjacent the first component 308.

Referring now to FIGS. 3c, 4a, 4b, 4c, 6a, and 6b, in operation, the cover 102 is coupled to the chassis 302 by coupling chassis coupling members 112a and 112b on cover 102 to cover coupling members 314a and 314b on chassis 302, respectively. In one embodiment, the chassis coupling members 112a and 112b and the cover coupling members 314a and 314b provide a hinge which allows a pivotal coupling of the cover 102 to the chassis 302 from an open position to a closed position.

To restrict access to the second component 310 on chassis surface 304, the cover 102 may be pivoted such that cover 102 engages chassis 102 in the closed position. Locking member 108 on cover 102 may then be activated such that it engages chassis locking member 316 on chassis surface 304, securing the cover 102 to the chassis 302. With the cover 102 secured to the chassis surface 304, second component 310 may not be accessed without deactivating the locking member 108 and moving the cover 102 to the open position. In an embodiment, securing cover 102 restricts access to the plurality of SCSI drives 310a and 310b and the power control 310c. However, the first component 308 may be accessed through opening 104. In one embodiment, if the chassis door 306 is closed when the cover 102 is secured to the chassis surface 304, the cover 102 engages the chassis door 306 such that the chassis door 306 is secured to the chassis 302, restricting access to the components housed inside of the chassis 302.

To restrict access to the first component 308, the panel 200 may be secured to the cover 102 by orienting the panel 200 such that the cover coupling members 204a, 204b, 204c, and 204d line up with panel coupling members 106a, 106b, 106c, and 106d on cover 102. The panel 200 is then brought into engagement with cover 102 by pushing the distal end 204ac of cover coupling member 204 into the panel coupling member 106a. Further pushing of cover coupling member 204a into panel coupling member 106a results in the beveled surface 204ac causing flexible beam 204aa to flex, allowing the cover coupling member 204a through the panel coupling member 106a until the catch surface 204ad contacts the back 102d of cover 102 adjacent the panel coupling member 106a and secures the cover coupling member 204a to the cover 102. Cover coupling members 204b, 204c, and 204d operate in substantially the same manner as cover coupling member 204a, and with all of the cover coupling members 204a, 204b, 204c, and 204d secured in their respective panel coupling members 106a, 106b, 106c, and 106d, the panel 200 is secured in the cover 102. With the panel 200 secured to the cover 102, the first component 308 may not be accessed without deactivating the locking member 108 and moving the cover 102 to the open position.

To allow access to the first component 308, the panel 200 may be removed from the cover 102 only by deactivating the locking member 108. Deactivating the locking member 108 allows the pivoting of the cover 102 away from the chassis surface 304 to the open position. The back 102d of cover 102 may then be accessed, allowing the flexing of each of the cover coupling members 204a, 204b, 204c, and 204d in order to release them from panel coupling members 106a, 106b, 106c, and 106d, respectively.

Figure 7A:
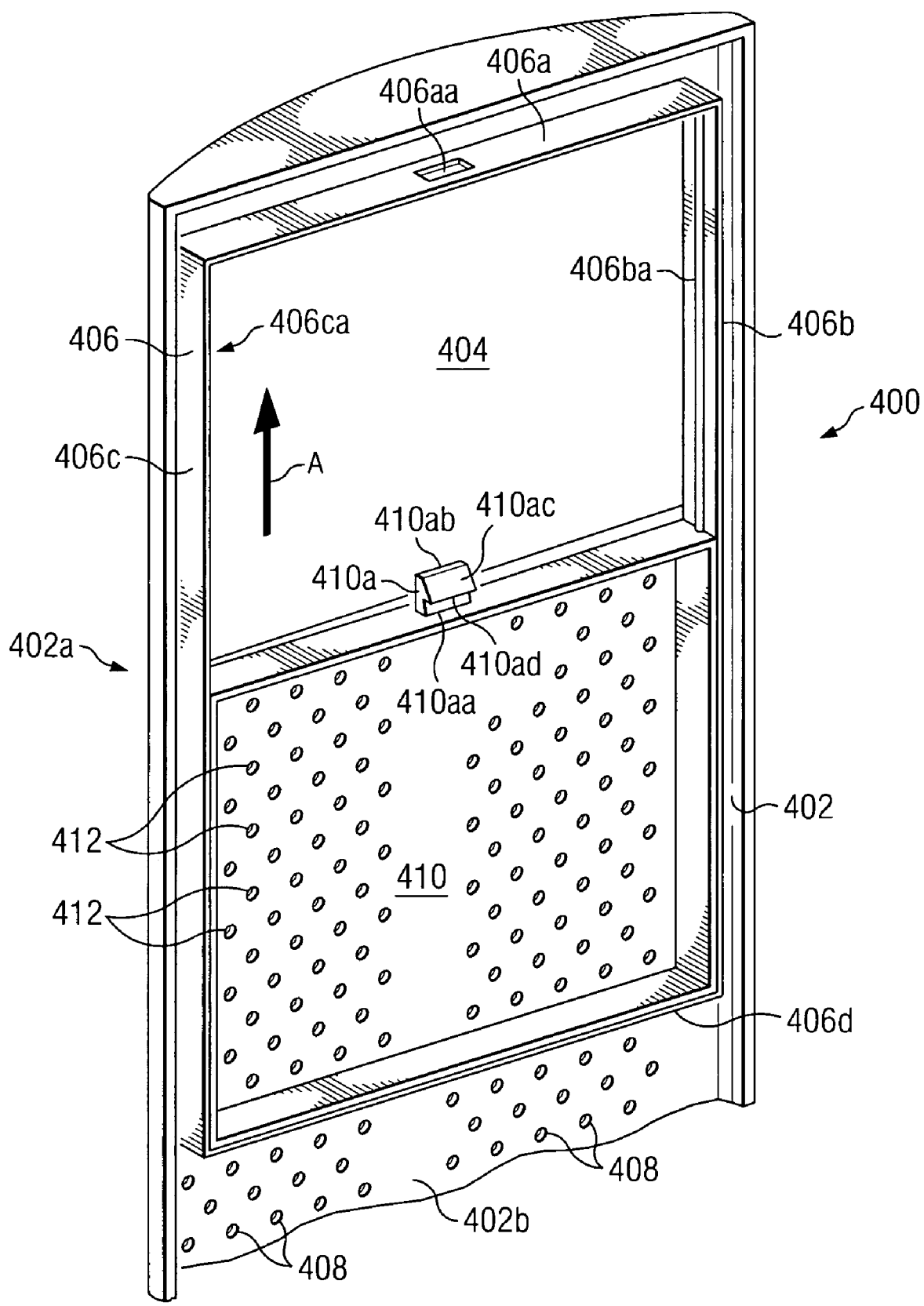
FIG. 7a is a rear perspective view illustrating an embodiment of a chassis cover and a panel for an apparatus for securing an information handling system.

Referring now to FIG. 7a, an alternative embodiment of an apparatus for securing an information handling system 400 is substantially identical in design and operation to the apparatus 100 and the apparatus 300 described above with reference to FIGS. 1, 2a, 2b, 3a, 3b, 3c, 4a, 4b, 4c, 5, 6a, and 6b with the provis a modified cover 402. Cover 402 includes a front 402a, a back 402b opposite the front 402a, and defines an opening 404 adjacent the top of the cover 402 and extending from the front 402a to the back 402b. A track 406 includes a top 406a, a side 406b, a side 406c, and a bottom 406d, and extends from the back 402b of cover 402, with the top 406a and a portion of the sides 406b and 406c positioned around a portion of the perimeter of opening 404. Top 406a defines a securing slot 406aa centrally located along its length. Sides 406b and 406c define channels 406ba (not shown) and 406ca, respectively, running along their lengths.

A plurality of apertures 408 are defined by the cover 402 and extend through the cover 402 from the front 402a to the back 402b. A panel 410 is positioned on the track 406 and moveably coupled to the channels 406ba and 406ca on sides 406b and 406c, respectively. Panel 410 includes a securing member 410a extending from its upper surface. Securing member 410a includes a flexible beam 410aa extending from the panel 410. A distal end 410ab of the beam 410aa includes a beveled surface 410ac and a catch surface 410ad. A plurality of apertures 412 are defined by the panel 410 and extend through the panel 410.

Figure 7B:
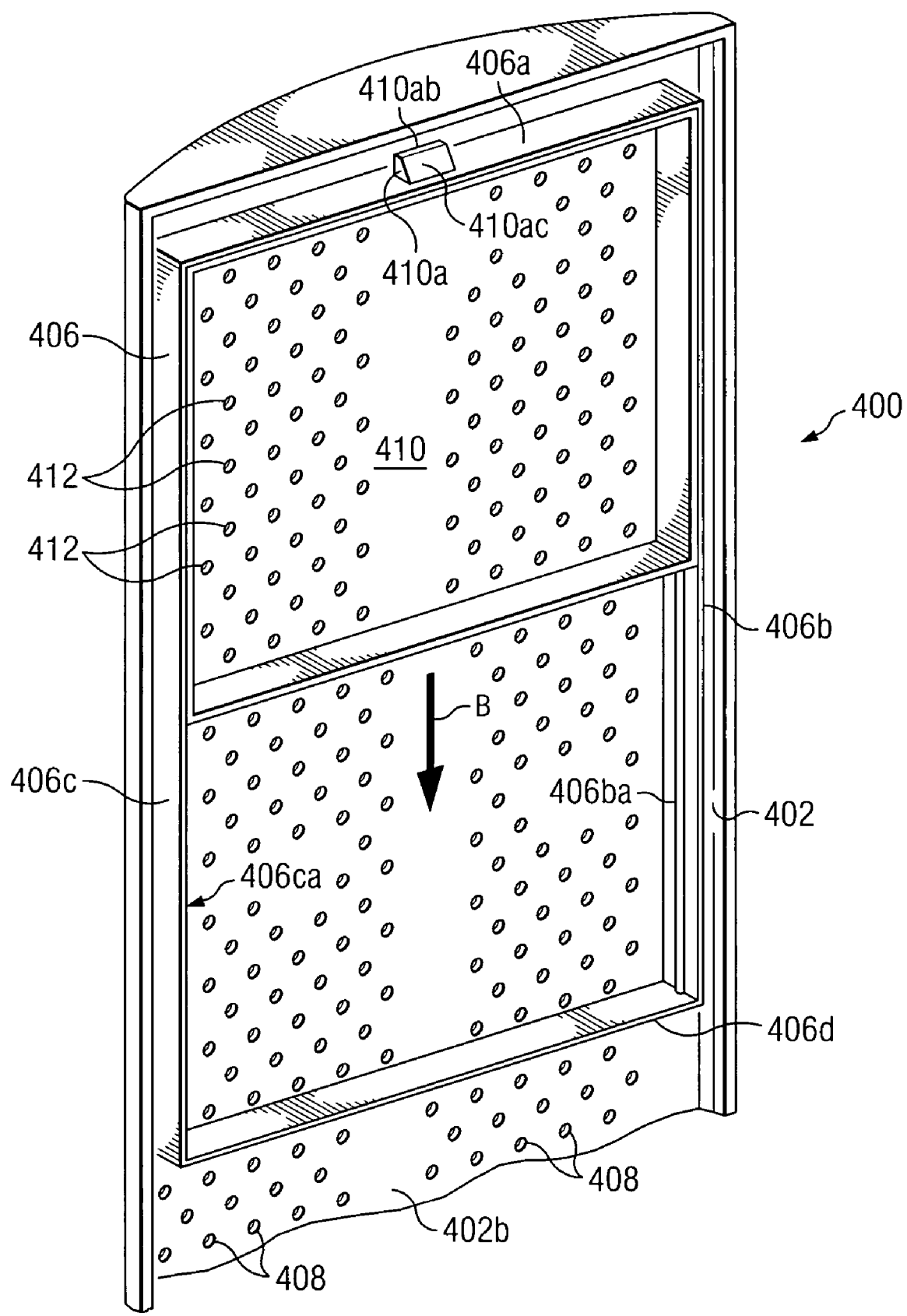

Referring now to FIGS. 7a and 7b, in operation, the panel 410 begins positioned adjacent the bottom 406d of track 406, allowing access through the cover 402 through opening 404. The panel 410 may be positioned in the opening 404 by translating the panel 410 in a direction A. The panel 410 may translate along the track 406 due to the moveable coupling between the channels 406ba and 406bc and the panel 410. As the panel 410 is translated in direction A, distal end 410ab of securing member 410a engages securing slot 406aa. Further translation of securing member 410a into securing slot 406aa results in the beveled surface 410ac causing flexible beam 410aa to flex, allowing the securing member 410a through the securing slot 406aa until the catch surface 410ad contacts the top 406a of track 406 and secures the panel 410 over the opening 404 defined by cover 402. The panel 410 may be removed from the opening 404 by flexing the securing member 410a such that securing member 410a may be removed from securing slot 406aa. Panel 410 may then be translated in a direction B along channels 406ba and 406ca and out of opening 404.

Figure 8A:
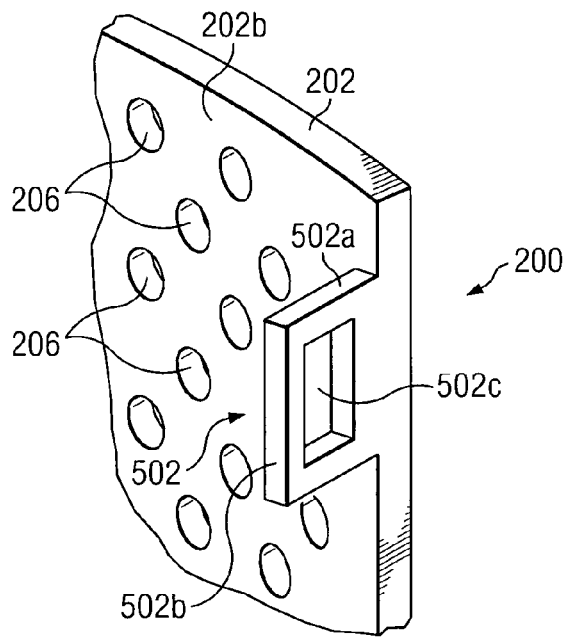
FIG. 8a is a perspective view illustrating an embodiment of a cover securing member used with the panel of FIGS. 3a and 3b.
Figure 8B:
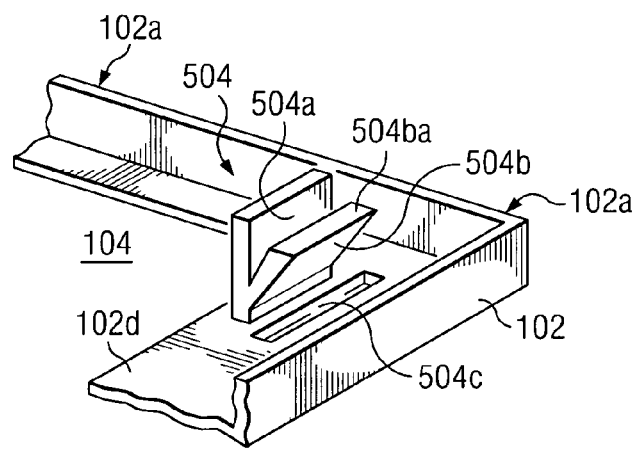
FIG. 8b is a perspective view illustrating an embodiment of a panel securing member used with the cover of FIGS. 2a and 2b.
Figure 9:
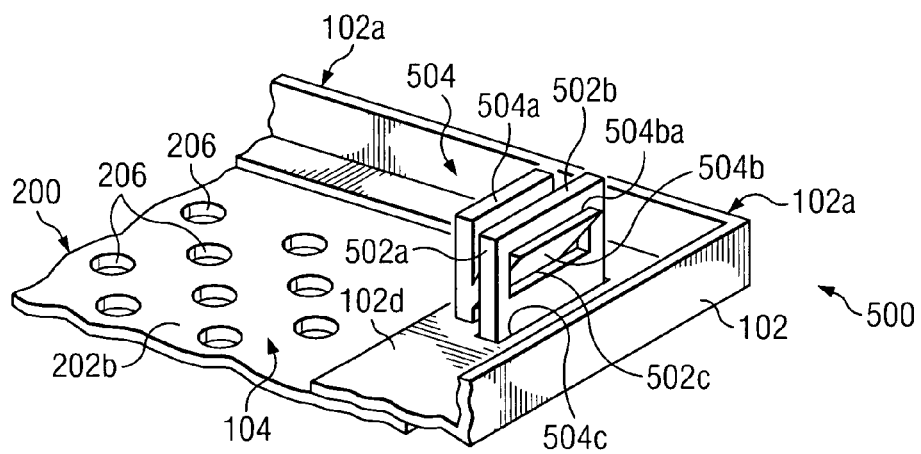
FIG. 9 is a rear perspective view illustrating an embodiment of the operation of the cover securing member of FIG. 8a and the panel securing member of FIG. 8b.

Referring now to FIGS. 8a, 8b and 9, an alternative embodiment of an apparatus for securing an information handling system 500 is substantially identical in design and operation to the apparatus 100 and the apparatus 300 described above with reference to FIGS. 1, 2a, 2b, 3a, 3b, 3c, 4a, 4b, 4c, 5, 6a, and 6b with provision of modified cover securing members 502 on panel 200 and modified panel securing members 504 on cover 102. Cover securing member 502 includes an elongated securing member 502a with a distal end 502b extending from the back 202b of panel 200. Elongated securing member 502a defines an opening 502c adjacent the distal end 502b. Panel securing member 504 includes base 504a with a flexible beam member 504b extending from the base 504a. Flexible beam member 504b includes a catch surface 504ba on its distal end. The cover 102 defines a passageway 504c adjacent the panel securing member 504 and extending through the cover 102. In an embodiment, the panel 200 and cover 102 may each include a plurality of cover securing members 502 and panel securing members 504, respectively.

Referring now to FIG. 9, in operation, the panel 200 may be secured to the cover 102 by placing the distal end 502b of elongated securing member 502a in passageway 504c and translating it through the passageway 504c. Distal end 502b will engage flexible beam member 504b and flex it towards base 504a, allowing cover securing member 502 through passageway 504c. As cover securing member 502 continues through passageway 504c, flexible beam member 504b will become positioned in opening 502c, with catch surface 504ba securing cover securing member 502 to panel securing member 504 and panel 200 to cover 102. To remove panel 200 from cover 102, flexible beam member 504b must be flexed back through opening 502c and cover securing member 502 removed from passageway 504c.

It is understood that variations may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for securing an information handling system comprising:
    a removable chassis cover for locking attachment to a chassis, the cover having an opening therein, and the chassis cover including a locking member for securing the cover to the chassis; and
    a removable panel for attachment to a portion of the cover, wherein absence of the panel reveals the opening and provides access to a portion of the chassis via the opening, and attachment of the panel closes the opening.

2. The apparatus of claim 1 wherein the chassis cover defines a plurality of apertures operable to allow airflow through the chassis cover.

3. The apparatus of claim 1 wherein the chassis cover includes at least one chassis coupling member operable to moveably couple the chassis cover to a chassis.

4. The apparatus of claim 1 whereby the removal of the panel is accomplished only when the chassis cover is removed from the chassis.

5. The apparatus of claim 1 wherein the panel defines a plurality of apertures operable to allow airflow through the panel.

6. The apparatus of claim 1 wherein the panel includes at least one cover coupling member operable to secure the panel to the chassis cover.

7. The apparatus of claim 1 wherein the panel is slidably coupled to the chassis cover.

8. The apparatus of claim 3 wherein the at least one chassis coupling member includes a hinge.

9. A chassis component securing system comprising:
    a chassis;
    a removable chassis cover coupled to the chassis, the chassis cover having an opening therein and the cover being moveable between an open and closed position;
    a locking member on the chassis cover operable to secure the cover to the chassis when the chassis cover is in the closed position; and
    a removable panel for attachment to a portion of the cover, wherein the absence of the panel reveals the opening and provides access to a portion of the chassis via the opening, and attachment of the panel closes the opening, whereby removal of the panel is accomplished only when the chassis cover is in the open position.

10. The system of claim 9 wherein the chassis cover is pivotably coupled to the chassis.

11. The system of claim 9 wherein the chassis cover defines a plurality of apertures operable to allow airflow through the chassis cover.

12. The system of claim 9 wherein the panel defines a plurality of apertures operable to allow airflow through the panel.

13. The system of claim 9 wherein the panel is slidably coupled to the chassis cover.

14. The system of claim 9 wherein the chassis includes a first component, whereby the chassis cover is operable to be secured over the first component.

15. The system of claim 9 wherein the chassis includes a second component, whereby when the chassis cover is secured to the chassis the second component is adjacent the opening.

16. The system of claim 14 wherein the first component includes at least one storage device.

17. The system of claim 14 wherein .the second component includes at least one peripheral device.

18. An information handling system comprising;
    a chassis;
    at least one storage device positioned in the chassis and coupled to the chassis;
    at least one peripheral device positioned in the chassis and coupled to the chassis;
    a removable chassis cover coupled to the chassis, the chassis cover having an opening therein and the cover being moveable between an open and closed position;
    a locking member on the chassis cover operable to secure the chassis cover to the chassis when the chassis is in the closed position, whereby when the chassis cover is secured to the chassis the chassis cover is secured over the storage device and the peripheral device is adjacent the opening; and
    a removable panel for attachment to a portion of the cover, wherein absence of the panel reveals the opening and provides access to a portion of the chassis via the opening, and attachment of the panel closes the opening, whereby removal of the panel is accomplished only when the chassis cover is in the open position.

19. The system of claim 18 wherein the chassis cover is pivotably coupled to the chassis.

20. The system of claim 18 wherein the chassis cover defines a plurality of apertures operable to allow airflow through the chassis cover.

21. The system of claim 18 wherein the panel defines a plurality of apertures operable to allow airflow through the panel.

22. The system of claim 18 wherein the panel is slidably coupled to the chassis cover.

23. A method for securing an information handling system comprising:
    providing a chassis;
    positioning an information handling system in the chassis, the information handling system including a first component and a second component;
    coupling a removable chassis covert including a locking member for securing the cover to the chassis, the chassis cover having an opening therein and the cover being moveable between an open and closed position;
    securing a removable panel in the opening wherein absence of the panel reveals the opening and provides access to a portion of the chassis via the opening, and attachment of the panel closes the opening; and
    closing and securing the chassis cover to the chassis, whereby the first component is covered by the chassis cover and the second component is covered by the panel.

24. The method of claim 23 further comprising:
    opening the chassis cover and removing the panel from the opening; and
    closing the securing the chassis cover to the chassis, whereby the first component is covered by the chassis cover and the second component is exposed through the opening.

* * * * *

UNITED STATES PATENT AND TRADEMARK OFFICE
CERTIFICATE OF CORRECTION

| | | |
|---|---|---|
| PATENT NO. | : 7,133,290 B2 | Page 1 of 1 |
| APPLICATION NO. | : 10/998072 | |
| DATED | : November 7, 2006 | |
| INVENTOR(S) | : Andrew T. Junkins et al. | |

It is certified that error appears in the above-identified patent and that said Letters Patent is hereby corrected as shown below:

Claim 23, Column 8, Line 48, delete "covert" and insert --cover-- .

Signed and Sealed this

Thirteenth Day of November, 2007

JON W. DUDAS
*Director of the United States Patent and Trademark Office*